(12) United States Patent
Ahn et al.

(10) Patent No.: US 7,235,446 B2
(45) Date of Patent: Jun. 26, 2007

(54) METHODS OF FORMING SILICON-DOPED ALUMINUM OXIDE, AND METHODS OF FORMING TRANSISTORS AND MEMORY DEVICES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/012,619

(22) Filed: Nov. 5, 2001

(65) Prior Publication Data

US 2002/0086555 A1 Jul. 4, 2002

Related U.S. Application Data

(62) Division of application No. 09/754,926, filed on Jan. 4, 2001, now Pat. No. 7,112,543.

(51) Int. Cl.
*H01L 21/8239* (2006.01)

(52) U.S. Cl. .................. 438/261; 438/287; 438/591; 438/593

(58) Field of Classification Search ............... 438/261, 438/263, 264, 593, 201, 211, 216, 591; 204/298.26, 204/298.16
See application file for complete search history.

(56) References Cited

U.S. PATENT DOCUMENTS

| | | | |
|---|---|---|---|
| 5,856,017 A | | 1/1999 | Matsuda et al. |
| 5,923,056 A | * | 7/1999 | Lee et al. .................. 257/192 |
| 5,981,366 A | * | 11/1999 | Koyama et al. ............ 438/593 |
| 6,093,612 A | | 7/2000 | Suh |
| 6,280,810 B1 | | 8/2001 | Nakamura et al. |
| 6,300,202 B1 | | 10/2001 | Hobbs et al. |
| 6,344,403 B1 | * | 2/2002 | Madhukar et al. .......... 438/503 |
| 6,438,030 B1 | * | 8/2002 | Hu et al. ................ 365/185.18 |
| 6,495,474 B1 | * | 12/2002 | Rafferty et al. ............. 438/766 |
| 6,524,918 B2 | * | 2/2003 | Park et al. .................. 438/287 |
| 6,541,079 B1 | | 4/2003 | Bojarczuk, Jr. et al. |
| 6,579,767 B2 | | 6/2003 | Park et al. |
| 6,809,010 B1 | | 10/2004 | Kinoshita et al. |
| 6,924,186 B2 | | 8/2005 | Sandhu et al. |
| 2001/0041250 A1 | | 11/2001 | Werkhoven et al. |
| 2002/0086521 A1 | | 7/2002 | Ahn et al. |

(Continued)

FOREIGN PATENT DOCUMENTS

JP 58-153372 A * 12/1983

(Continued)

OTHER PUBLICATIONS

Vossen and Kern, Thin Film Processes II, Academic Press: Boston, 1991, pp. 80-81, 108-109, 113-115, 188, 200.*

(Continued)

*Primary Examiner*—Stephen W. Smoot
(74) *Attorney, Agent, or Firm*—Wells St. John P.S.

(57) ABSTRACT

The invention encompasses a method of forming a silicon-doped aluminum oxide. Aluminum oxide and silicon monoxide are co-evaporated. Subsequently, at least some of the evaporated aluminum oxide and silicon monoxide is deposited on a substrate to form the silicon-doped aluminum oxide on the substrate. The invention also encompasses methods of forming transistors and flash memory devices.

6 Claims, 5 Drawing Sheets

U.S. PATENT DOCUMENTS

| 2002/0086555 A1 | 7/2002 | Ahn et al. |
|---|---|---|
| 2002/0086556 A1 | 7/2002 | Ahn et al. |

FOREIGN PATENT DOCUMENTS

| JP | 60-167352 A | | 8/1985 |
|---|---|---|---|
| JP | 60167352 A | * | 8/1985 |

OTHER PUBLICATIONS

Wolf, Silicon Processing for the VLSI Era, vol. 1 : Process Technology, Lattice Press: Sunset Beach, CA 1986, p. 5.*

"Tunneling Leakage Current In Ultrathin (<4nm) Nitride/Oxide Stack Dielectrics", Ying Shi, Xiewen Wang, and T.P. Ma; pp. 388-390; IEEE Electron Device Letters; vol. 19, No. 10, Oct. 1998.

A Novel High $K$ Inter-Poly Dielectric(IPD), $Al_2O_3$ for Low Voltage/High Speed Flash Memories; Erasing in msecs at 3.3V; W.H. Lee, J.T. Clemens, R.C. Keller, and L. Marchanda; 1997 Symposium on VLSI Technology Digest of Technical Papers; pp. 117-138.

"Substrate dependence on the optical properties of $Al_2O_3$ films grown by atomic layer deposition"; Y. Kim, S.M. Lee, C.S. Park, S.I. Lee, and M.Y. Lee; Appl. Phys. Lett. 71 (25) Dec. 22, 1997; pp. 3604-3606.

"The effects of oxidation temperature on the capacitance-voltage characteristics of Oxidized AlN films on Si"; J. Kolodzey, E.A. Chowdhury, G. Qui, J. Olowolafe; C.P. Swann; K.M. Unruh; J. Suehle, R.G. Wilson, J.M. Zavada; Appl. Phys. Lett. 71 (26) Dec. 29, 1997; pp. 3802-3804.

"High K Dielectrics for CMOS and Flash"; L. Manchanda; Extended Abstracts of the 1999 Internatioanl Conference on Solid State Devices and Materials, Tokyo; pp. 150-151.

"Aluminum oxide films obtained by electron-beam evaporation"; L.V. Veidenbakh and S. N. Gromova; Sov. J. Opt. Technology. 50 (9) Sep. 1983; © 1984 The Optical Soceity of America; pp. 566-568.

"Investigation of aluminum oxide films by mass-and IR-spectrometric methods"; S.N. Gromova, E.A. Nikolaeva, and E.V. Prokof'ev; Sov. J. Opt. Technol. 56(11), Nov. 1989; © 1990 The Optical Society of America; pp. 667-669.

"Effect of substrate temperature on density of aluminum oxide films" E.B. Brik; Sov. J. Opt. Technol. 57(1), Jan. 1990; © 1990 The Optical Society of America; pp. 50-52.

"Rapid thermal oxidation of silicon monoxide"; E. Fogarassy, A. Slaoui, C. Fuchs, and J.L. Regolini;Appl. Phys. Lett. 51(5), Aug. 3, 1987; © 1987 American Institute of Physics; pp. 337-339.

"Low Temperature Ion-Assisted Deposition of Thermally Evaporated Silicon Monoxide"; I.C. Stevenson; Society of Vacuum Coaters; $37^{th}$ Annual Technical Conference Proceedings (1994); pp. 81-84.

Article from IBM Website, Intellectual Property Network; US 5923056:"Electronic components with doped metal oxide dielectric materials and a process for making electronic components with doped metal oxide dielectric material"; Lee; Woo-Hyeong and Manchanda; Lalita; issued Jul. 13, 1999.

Guo, X. et al., "High Quality Ultra-Thin (1.5 nm) $TiO_2/Si_3N_4$ Gate Dielectric for Deep Sub-Micron CMOS Technology", IEDM Sep. 1999, pp. 137-140.

Luan, H. et al., "High Quality $Ta_2O_5$ Gate Dielectrics with $T_{ox,eq}$ <10Å", IEDM Sep. 1999, pp. 141-144.

Manchanda, L., "High K Dielectrics for CMOS and Flash", Extended Abstracts of the 1999 Internatl. Conf. on Solid State Devices and Materials, Tokyo 1999, pp. 150-151. (The year of publication is sufficiently early such that the month is not in issue.).

Kim, C. et al., "Application of $Al_2O_3$ Grown by Atomic Layer Deposition to DRAM and FeRAM", Mar. 13, 2000, 1 page.

Franzen, W. et al., "Study of Oxygen-Ion-Beam Assisted Evaporated Aluminum Oxide Films", Materials Research Society Sympos. Proceedings: Beam Solid Interactions: Fundamentals and Applications, vol. 279, Nov. 30-Dec. 4, 1992, Boston, MA, pp. 825-830.

Zywitzki, O. et al., "Effect of Plasma Activation on the Phase Transformations of Aluminum Oxide", Surface and Coatings Technology 76-77, 1995, pp. 754-762. (The year of publication is sufficiently early such that the month is not in issue.).

Chand, N. et al., "Tunability of Intrinsic Stress in $SiO_2$ Dielectric Films Formed by Molecular Beam Deposition", Materials Research Society Symposia Proceedings, vol. 356, 1995, pp. 195-200. (The year of publication is sufficiently early such that the month is not in issue.).

Rancourt, J., "Optical Thin Films IV; New Developments", SPIE—Proceedings of Internatl. Soc. for Optical Engineering, Jul. 1994, San Diego, CA, vol. 2262, pp. 14-21.

Wolf, S., "Silicon Processing for the VLSI Era", vol. 2: Process Integration, 1990 Lattice Press, Sunset Beach, CA, pp. 332-333.

Vossen and Kern. "Thin Film Processes II", Academic Press: Boston, 1991, p. 110, Year is sufficiently early so that the month is not an issue.

Wolf et al., Silicon Processing for the VLSI Era, vol. 1-Process Technology, Lattice Press: Sunset Beach CA, 1986, p. 323.

Wolf et al., Silicon Processing for the VLSI Era, vol. 2-Process Integration, Lattice Press: Sunset Beach CA, 1990, p. 354-356.

Wikipedia (an online dictionary) (http://en.wikipedia.org/wiki/sapphire).

* cited by examiner

METHODS OF FORMING SILICON-DOPED ALUMINUM OXIDE, AND METHODS OF FORMING TRANSISTORS AND MEMORY DEVICES

RELATED PATENT DATA

This patent resulted from a divisional application of U.S. patent application Ser. No. 09/754,926, which was filed on Jan. 4, 2001 now U.S. Pat. No. 7,112,543.

TECHNICAL FIELD

The invention pertains to methods of forming silicon-doped aluminum oxide, and in particular embodiments pertains to methods of forming transistor structures and memory devices.

BACKGROUND OF THE INVENTION

As silicon device sizes become increasingly smaller, it can be increasingly difficult to form gate insulators capable of maintaining the capacitance of a dynamic random access memory (DRAM) cell in the range of 30 femptofarads (fF). Such capacitance is desired to achieve immunity to radiation and soft errors, and to keep noise to acceptable levels.

A commonly utilized dielectric material is silicon dioxide ($SiO_2$). However such can be difficult to utilize in the 30 fF regime because the dielectric becomes so thin that direct band-to-band tunneling current or Fowler-Nordheim tunneling current becomes problematic. Accordingly, there has been an effort to utilize high-k (i.e., high dielectric constant) films (such as $Al_2O_3$, $Ta_2O_5$, and $TiO_2$), as materials to substitute for the very thin silicon dioxide as dielectric materials in semiconductor devices.

Of the listed high-k materials, aluminum oxide has received significant interest. Aluminum oxide has been used as a high-k inter-poly dielectric (IPD) for low voltage/high speed flash memories. Specifically, it has been shown that 10 nanometer thick $Al_2O_3$, with k of about 10, can reduce an erasing time by three orders of magnitude in comparison with 15 nanometer thick ONO (with ONO referring to a sandwich of silicon dioxide, silicon nitride, and silicon dioxide). The ONO has a k of about 10. Aluminum oxide can reduce the erasing voltage of a flash memory device by about 40% compared with silicon dioxide, and about 27% compared with ONO of the same thickness as the aluminum oxide.

Difficulties associated with $Al_2O_3$ films include that the optical properties of the films can vary significantly depending on the substrate that the film is grown on. For instance, studies have been done in which $Al_2O_3$ films have been grown by atomic layer deposition on Si, $SiO_2$ and TiN, and the studies have found significant differences in the optical properties of the film depending on the underlying substrate.

There has recently been some investigation on the effects of dopant addition to aluminum oxide which indicates that particular dopants can improve the properties of aluminum oxide. Specifically, the studies indicate that either silicon or zirconium can be added to an aluminum material to form a doped $Al_2O_3$ film with low leakage current and high thermal stability (up to 800° C.), and with a dielectric constant greater than 8. It can be preferred to keep the dielectric constant high, and preferably to keep the dielectric constant above 10, as there is likely a limited opportunity for dielectric materials with a constant less than 10 to replace silicon dioxide. However, alternate gate dielectrics having dielectric constants greater than 10, and more preferably greater than 15, may ultimately be desired as replacements for the silicon dioxide materials currently being utilized.

Some work with aluminum oxide has focused on methods of deposition of thin films of aluminum oxide. For instance, there has been development of procedures for atomic layer deposition (ALD) of aluminum oxide to DRAM and FeRAM (ferroelectric random access memory). It is found that ALD films typically have lower leakage current and larger dielectric breakdown voltage than conventional thermal oxide materials. The leakage characteristics of MIS aluminum oxide capacitors are lower than that of MIS-$Ta_2O_5$ capacitors. Also, it is found that the ALD aluminum oxide can have low leakage and low interface surface state densities.

A method of forming thin aluminum oxide films is to evaporate sapphire (a form of high-purity aluminum oxide), and to subsequently condense the evaporated material on a substrate. Sapphire can be evaporated by, for example, electron gun evaporation or ion beam evaporation (also called ion beam deposition). It is noted that aluminum oxide films have also been deposited by thermal evaporation of single crystal sapphire. In some instances, aluminum oxide can be evaporated and deposited within a vacuum chamber under conditions in which no additional oxygen is admitted to the vacuum chamber during evaporation, and in which a substrate temperature is varied between 80° C. and 140° C. A typical deposition rate can be from about 10 Å per second to about 12 Å per second. The electrical breakdown voltage and resistivity can be improved at higher substrate temperatures. It is found that if the films are exposed to 98% relative humidity, the breakdown voltage can change to a significantly lower value, such as, for example, to a value of from about $10^6$ volts/cm to about $10^4$ volts/cm.

The aging properties of electron gun evaporated alumina films have been investigated by mass spectrometry and IR spectrometry. It has been found that if films are stored under normal atmospheric conditions, a characteristic absorption's peak will appear in the infrared reflection spectra which has been attributed to a build-up of water in the $Al_2O_3$ films. Such can cause the films to lose dielectric properties, and the breakdown voltage can decrease by several orders of magnitude.

Subsequent studies using electron-optical examination of the cross-section of vacuum-deposited aluminum oxide films shows that the films are amorphous on cold substrates. However, as the substrate temperature increases, an acicular crystalline structure appears for films having thicknesses on the order of 100 nanometers, with typical column diameters of from about 12 nanometers to about 17 nanometers. Such structure leads to high film porosity, with a considerable fraction of the pores extending through the entire thickness of the structure and being filled with water if a humidity is 70% and higher. Other reports have described a porosity of about 5% for films prepared at 60° C. The relative porosity of aluminum oxide is also evidenced by examination of the protective properties of aluminum oxide layers (100 nanometers) prepared at room temperature on silver mirrors. Specifically, the films are found to not exhibit protective properties against corrosive agents such as water and hydrogen sulfide.

Studies of electron-beam evaporated aluminum oxide films grown under oxygen ion bombardment indicate that an index of refraction, and accordingly the film density, first rises, and then decreases with increasing ion current density for substrate temperatures between 70° C. and 250° C. Ion bombardment during deposition is thought to cause the film to become more compact by inhibiting columnar growth.

Similar investigations on the effect of plasma activation on the phase transformation of aluminum oxide films have been done with films deposited by reactive high-rate electron beam evaporation. Plasma activation of the vapor took place via a hollow-cathode plasma. Aluminum oxide films deposited at 500° C. and 700° C. without plasma activation were characterized by columnar structure, and exhibited a relatively high porosity. However, films deposited with plasma activation at the same temperatures showed glassy fracture and a much denser microstructure.

It would be desirable to develop improved methods for forming aluminum oxide films suitable for utilization as dielectric materials in semiconductor structures, such as, for example, aluminum oxide films suitable as dielectric materials in transistor gate structures and flash memory device structures.

SUMMARY OF THE INVENTION

In one aspect, the invention encompasses a method of forming a silicon-doped aluminum oxide. Aluminum oxide and silicon monoxide are co-evaporated. Subsequently, at least some of the evaporated aluminum oxide and silicon monoxide is deposited on a substrate to form the silicon-doped aluminum oxide on the substrate.

In another aspect, the invention encompasses a method of forming a transistor. An insulating layer of silicon-doped aluminum oxide is formed over a substrate. The forming of the insulating layer of silicon-doped aluminum oxide comprises co-evaporation of aluminum oxide and silicon monoxide, and deposition of at least some of the evaporated aluminum oxide and silicon monoxide on the substrate to form the silicon-doped aluminum oxide on the substrate. A patterned conductive material is formed over the insulating layer of silicon-doped aluminum oxide. A pair of conductive source/drain regions are spaced from one another by the patterned conductive material, with the conductive material thus defining a transistor gate between the source/drain regions.

In yet another aspect, the invention pertains to methods of forming flash memory devices.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses an improved method of depositing silicon-doped aluminum oxide films which can have high reliability (specifically, for example, low leakage current and high thermal stability). The films can be deposited by co-evaporation of aluminum-oxide and silicon monoxide (SiO), and subsequent condensation of the co-evaporated materials onto a substrate. More specifically, porous $Al_2O_3$ films can be formed by electron gun-evaporation or ion beam deposition (in accordance with the present invention, the evaporation of aluminum oxide is conducted in high vacuum, and not in a partial pressure of oxygen). Simultaneously with the formation of the porous aluminum oxide film, silicon monoxide is thermally evaporated to produce a silicon dopant which is incorporated into the aluminum oxide film during formation of the film (i.e., in situ as the film forms). Any oxygen deficiency of the evaporated aluminum oxide can be supplied by oxygen in the silicon monoxide while the silicon of the silicon monoxide becomes a dopant within the aluminum oxide film.

A relative concentration of silicon within the aluminum oxide can be adjusted by controlling the evaporation rate of the silicon monoxide relative to that of the aluminum oxide. Preferably, the films will have at least 0.1 weight percent of silicon dopant provided within the aluminum oxide, to a maximum of 30 weight percent of the silicon dopant within the aluminum oxide. The films formed by methodology of the present invention can be utilized as gate dielectric for various semiconductor devices, such as, for example, MOS devices and flash memory devices.

Figure 1:
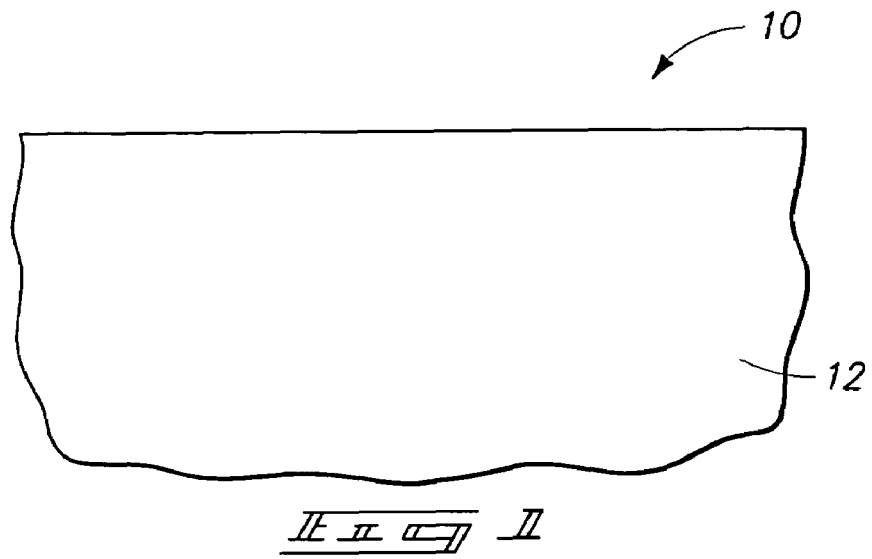
FIG. 1 is a diagrammatic, cross-sectional view of a semiconductor substrate wafer fragment at a preliminary step of a method of the present invention.

Methodology of the present invention is described with reference to FIGS. 1–9. Referring first to FIG. 1, a semiconductor wafer fragment 10 is illustrated at a preliminary step of a method of the present invention. Wafer fragment 10 comprises a substrate 12. Substrate 12 can comprise, for example, monocrystalline silicon lightly-background doped with a p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
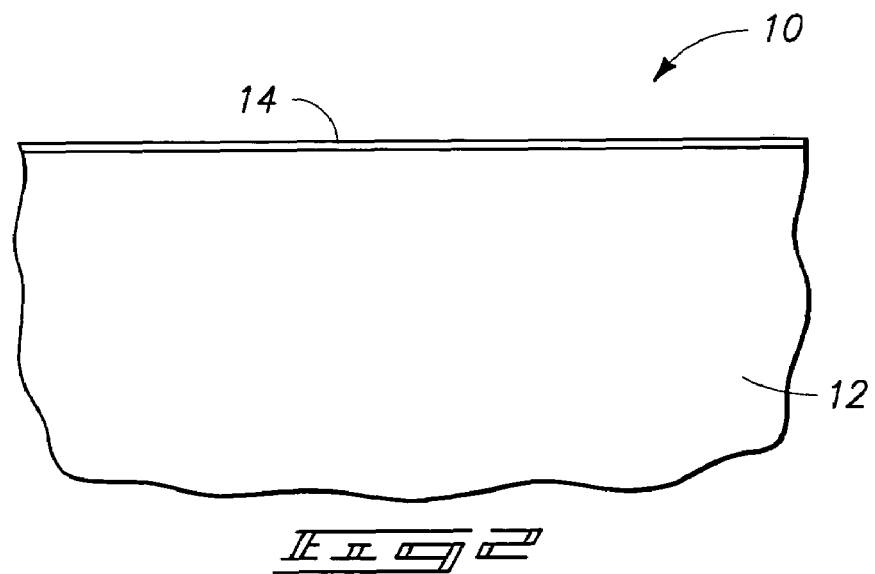
FIG. 2 is a view of the FIG. 1 wafer fragment shown at a processing step subsequent to that of FIG. 1.

Referring next to FIG. 2, wafer fragment 10 is shown at a processing step subsequent to that of FIG. 1. Specifically, wafer fragment 10 is shown with an insulating dielectric layer 14 formed over substrate 12. Dielectric layer 14 can comprise, for example, silicon-doped aluminum oxide (Si—$Al_2O_3$).

Dielectric layer 14 can be formed by co-evaporation of aluminum oxide and silicon monoxide, and subsequent condensation of the co-evaporated materials onto substrate 12. An exemplary method of co-evaporating and condensing aluminum oxide and silicon monoxide is described with reference to FIG. 9, which shows a reaction chamber 100. A vacuum can be provided within chamber 100, and $O_2$ can be precluded from flowing into chamber 100. An aluminum oxide source 102 is provided within chamber 100, and a silicon monoxide source 104 is also provided within chamber 100. Aluminum oxide source 102 can comprise, for example, single crystal sapphire.

A substrate 106 (which can comprise, for example, the wafer fragment 10 of FIG. 2), is also provided within chamber 100, and is shown on a substrate holder 108. Holder 108 can be provided with a thermal control mechanism, such as, for example, a heater, or a cooler. Holder 108 can thus be utilized to control a temperature of substrate 106.

In operation, silicon monoxide is evaporated from source 104 (illustrated by arrow 110), and aluminum oxide is evaporated from 102 (illustrated by arrow 112) to form a vapor mixture of aluminum oxide and silicon monoxide within chamber 100. The co-evaporated aluminum oxide and silicon monoxide are co-condensed onto substrate 106 to deposit dielectric layer 14 (not shown in FIG. 9) onto the substrate.

Figure 9:
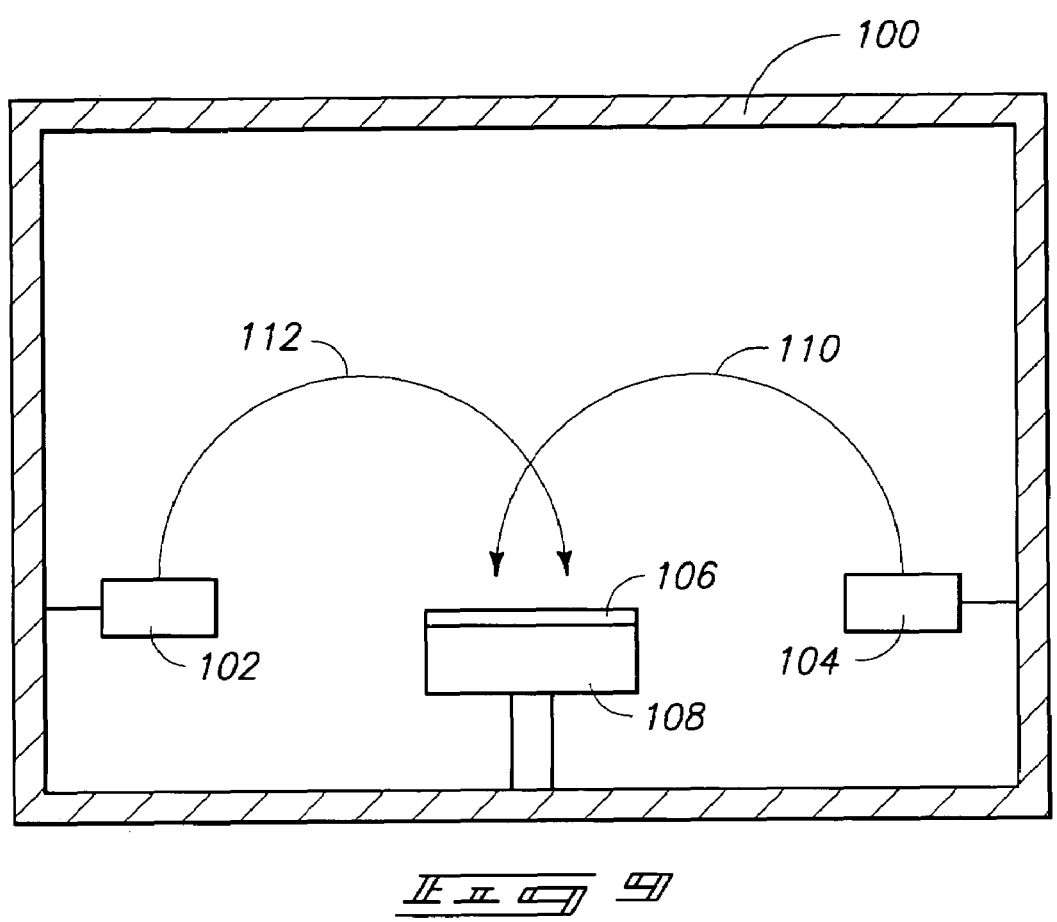
FIG. 9 is a diagrammatic, cross-sectional view of a reaction chamber illustrating a deposition process which can be utilized in methodology of the present invention.

It is noted that chamber 100 is shown diagrammatically in FIG. 9, and that numerous configurations of a reaction chamber can be utilized in methodology of the present invention. Also, it is noted that even though aluminum oxide and silicon monoxide are shown being co-evaporated within reaction chamber 100, the invention encompasses other embodiments (not shown) wherein one or both of the evaporated aluminum oxide and silicon monoxide are formed outside of chamber 100 and subsequently flowed into chamber 100 to condense on substrate 106 and thereby deposit dielectric layer 14 onto the substrate.

The evaporation of silicon monoxide can be readily accomplished. Silicon monoxide can be evaporated from a thermal source and deposited onto a "cold" (room temperature) substrate with good adhesion. Silicon monoxide films formed by thermal evaporation have many attractive optical, electrical, mechanical and thermal properties, which can make the films suitable for many semiconductor applications. For instance, silicon monoxide can be thermally evaporated at much lower temperatures than silicon, silicon dioxide, or silicon nitride ($Si_3N_4$), and it condenses on cooler substrates in a uniform and adherent stoichiometric silicon monoxide film when evaporated at high vacuum. In fact, before the present day technology of silicon dioxide deposition by CVD (chemical vapor deposition), and when sputtering was not available, silicon monoxide was deposited by thermal evaporation and subsequently oxidized for rapid thermal oxidation. Such technique demonstrated the possibility of converting silicon monoxide deposited at room temperature to silicon dioxide by rapid thermal annealing at 700° C. to 1,100° C., but with a duration of only a few seconds, as compared with the ordinary thermal oxidation which takes a period ranging from 30 to 60 minutes at 1,000° C.

Another aspect of silicon monoxide chemistry is that it has been shown that the production of silicon dioxide films on a large substrate area by ion deposition of silicon monoxide can be accomplished. For instance, silicon dioxide films can be produced by active evaporation of silicon monoxide with oxygen assisted deposition (IAD). In addition to the benefits of ion bombardment on film properties, this approach can offer attractive advantages over electron beam evaporation of silicon dioxide. For instance, the evaporation source can be relatively cheap, simple, and easy to control. The production of silicon dioxide films on over 41 inches diameter by resistance evaporation of silicon monoxide and simultaneous oxygen ion bombardment from a cold cathode ion source has also been achieved. Additionally, processes have been developed to convert silicon monoxide to silicon dioxide during deposition by the use of an ion beam. However, additional oxygen should be supplied in a sufficiently energetic process to provide the material conversion during or after the silicon monoxide deposition on the surface.

Figure 3:
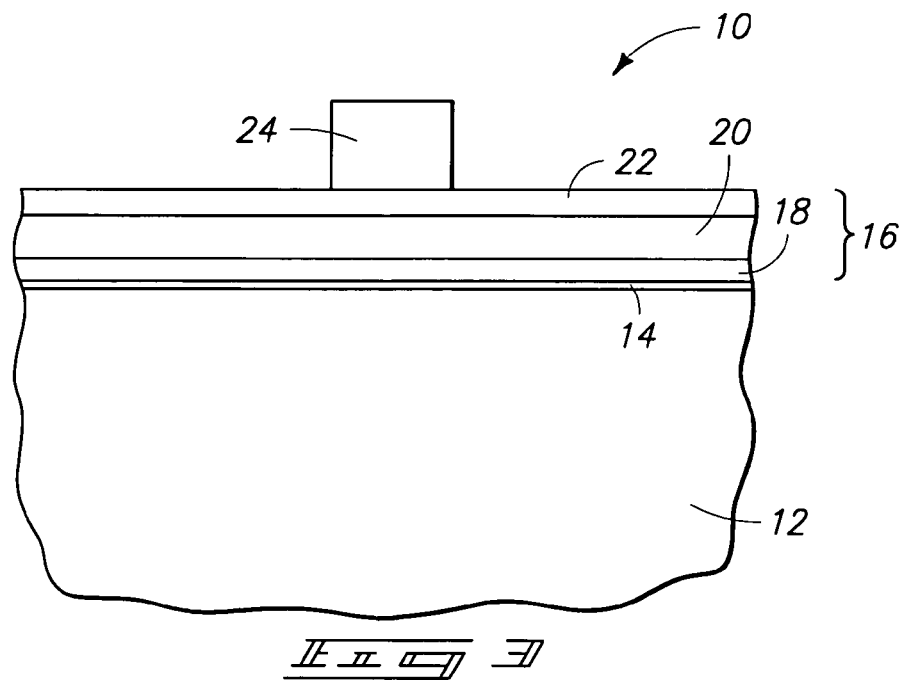
FIG. 3 is a view of the FIG. 1 wafer fragment shown at a processing step subsequent to that of FIG. 2.

Referring next to FIG. 3, a stack 16 of materials is provided over dielectric layer 14. Stack 16 can comprise, for example, a conductively doped silicon layer 18 (for instance, either n-type doped or p-type doped polysilicon), a metal silicide layer 20 (for instance, titanium silicide or tungsten silicide), and an insulative material layer 22 (for instance, either silicon nitride or $SiO_2$. Stack 16 can ultimately be utilized for forming a transistor gate. It is noted that the shown stack 16 is an exemplary mass which can be provided over dielectric layer 14. Other masses can be provided over dielectric material 14, and, for example, other conductive layers can be provided over dielectric material 14. In the shown embodiment, a patterned photoresist block 24 is shown formed over stack 16. Photoresist block 24 can be formed by, for example, providing a layer of photoresist over stack 16 and subsequently patterning the layer of photoresist utilizing photolithographic methods. Block 24 defines a transistor gate shape therebeneath.

Figure 4:
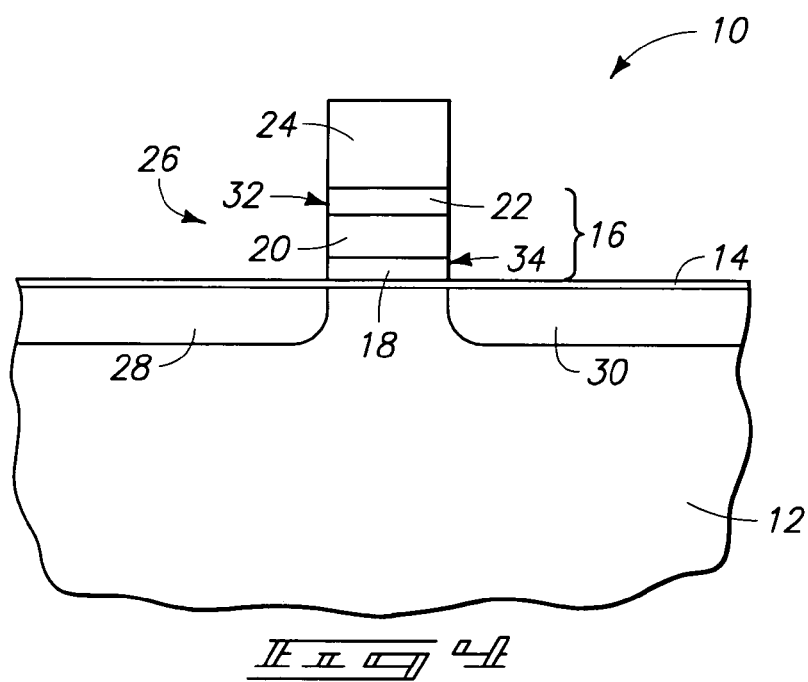
FIG. 4 is a view of the FIG. 1 wafer fragment shown at a processing step subsequent to that of FIG. 3.
Figure 5:
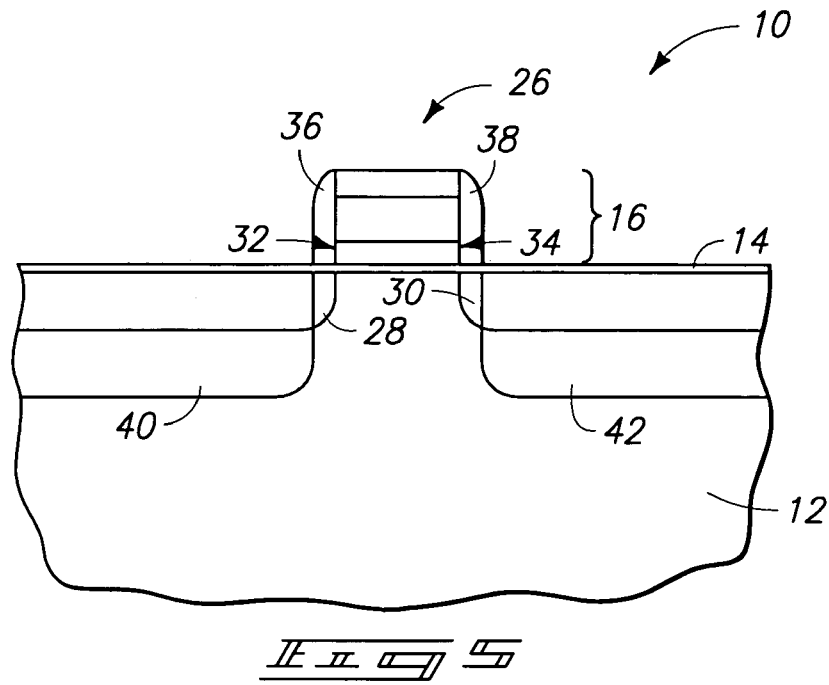
FIG. 5 is a view of the FIG. 1 wafer fragment shown at a processing step subsequent to that of FIG. 4.

Referring to FIG. 4, a pattern is transferred from photoresist block 24 to stack 16 to form a transistor gate structure 26 comprising the materials of stack 16. Subsequently, source/drain regions 28 and 30 can be formed by implanting conductivity-enhancing dopant through dielectric material 14 and into substrate 12. Stack 16 and source/drain regions 28 and 30 together define a transistor structure. It is noted that patterned stack 16 comprises opposing sidewalls 32 and 34, and that source/drain regions 28 and 30 are shown extending to about opposing sidewalls 32 and 34. In practice, the shown source/drain regions 28 and 30 would typically be lightly-doped diffusion regions. FIG. 5 shows that sidewall spacers 36 and 38 can be formed adjacent opposing sidewalls 32 and 34, respectively, and that heavily-doped source/drain regions 40 and 42 can then be formed within substrate 12 by implanting conductivity enhancing-dopant into the substrate. Sidewall spacers 36 and 38 can comprise, for example, an insulative material such as silicon dioxide or silicon nitride, and can be formed by providing the insulative material along sidewall edges 32 and 34 and subsequently anisotropically etching the insulative material. Source/drain regions 28, 30, 40 and 42 can comprise either n-type and p-type conductivity-enhancing dopant.

FIG. 5 also shows that photoresist block 24 (FIG. 4) is removed from over transistor gate structure 26.

Figure 6:
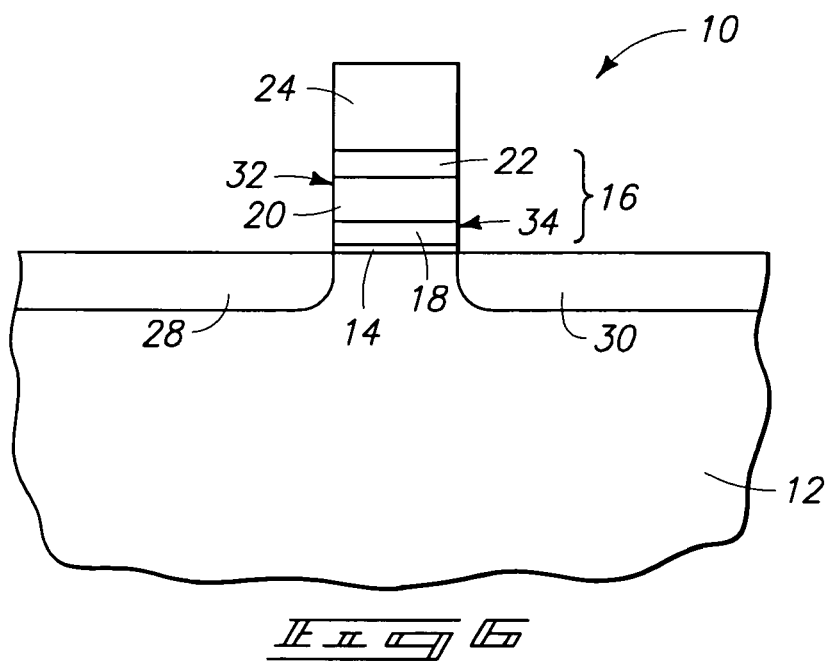
FIG. 6 is a view of the FIG. 1 wafer fragment shown at a processing step subsequent to that of FIG. 3 in one aspect of the invention, and subsequent to that of FIG. 4 in another aspect of the invention.

Referring next to FIG. 6, wafer fragment 10 is shown at a processing step that can follow the processing of either FIG. 3 or FIG. 4. Specifically, the processing step of FIG. 6 shows dielectric material 14 patterned with the stack 16, and accordingly shows dielectric material 14 having sidewall edges co-extensive with sidewall edges 32 and 34 of patterned stack 16. The processing step of FIG. 6 can follow the processing of FIG. 3 if the patterning of stack 16 comprises an etch that extends into dielectric material 14. Alternatively, the structure of FIG. 6 can follow the processing of FIG. 4 if a subsequent etch is utilized after the etching of stack 16 to further etch into dielectric material 14.

Figure 7:
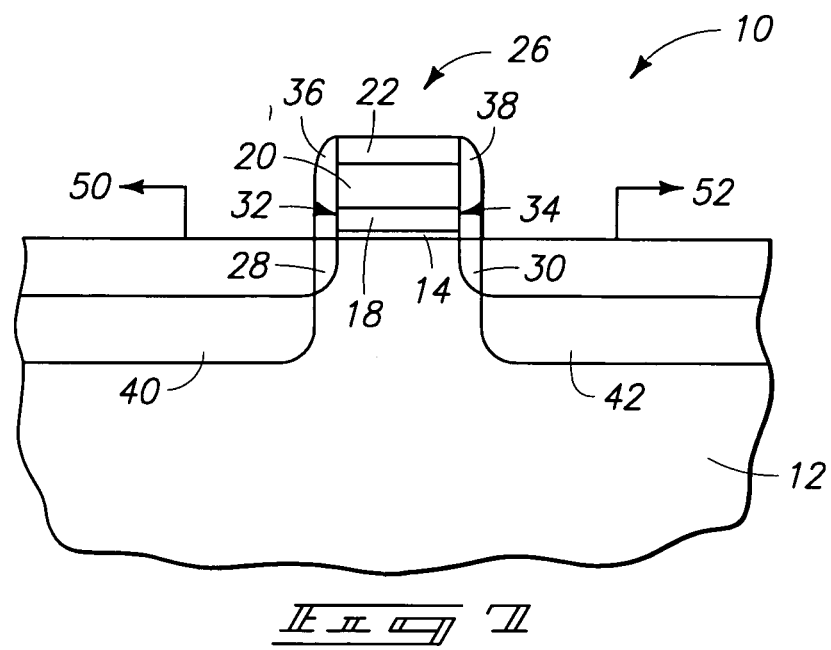
FIG. 7 is a view of the FIG. 1 wafer fragment shown at a processing step subsequent to that of FIG. 6.

FIG. 7 shows wafer fragment 10 at a processing step subsequent to that of FIG. 6, and shows sidewall spacers 36 and 38 formed adjacent opposing sidewalls 32 and 34 analogously to the processing described above with reference to FIG. 5.

After spacers 36 and 38 are formed, a conductivity enhancing dopant can be implanted into substrate 12 to form heavily doped source/drain regions 40 and 42. Transistor gate 26, together with regions 40, 42, 28 and 30, defines a transistor structure. In subsequent processing, one of the source/drain regions can be connected to a capacitor structure 50, and the other connected to a bit line 52 to define a DRAM cell.

Figure 8:
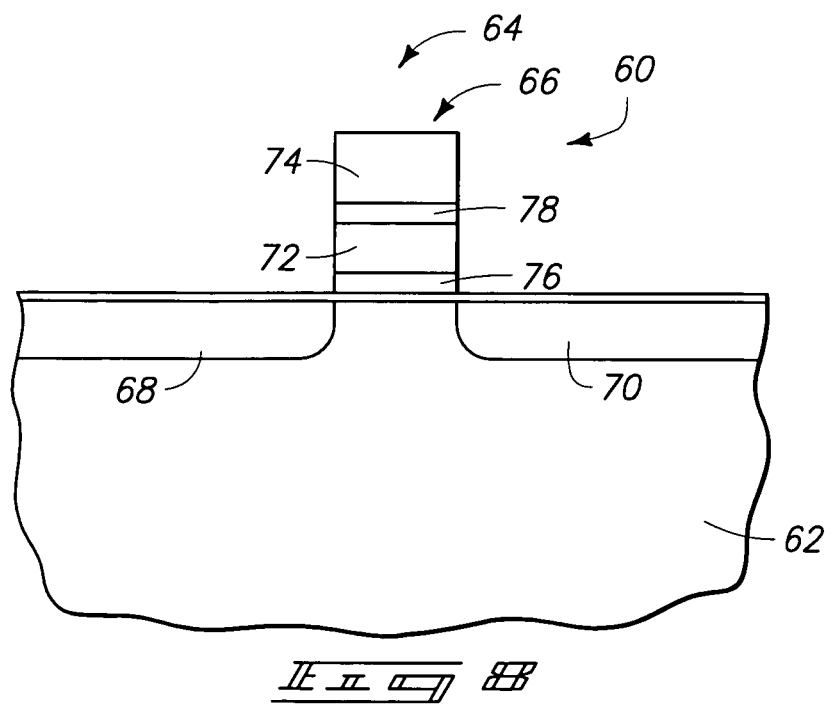
FIG. 8 is a diagrammatic, cross-sectional view of a semiconductor substrate wafer fragment illustrating a flash memory device formed in accordance with a method of the present invention.

FIG. 8 illustrates another embodiment of the present invention, and illustrates how a dielectric material formed in accordance with the present invention can be utilized in a flash memory cell. Specifically, FIG. 8 illustrates a wafer fragment 60 comprising a substrate 62 and a flash memory cell 64 supported by substrate 62. Substrate 62 can comprise monocrystalline silicon, and can be similar or identical to the substrate 12 described above with reference to FIGS. 1–7.

Memory cell 64 comprises a gate structure 66 and source/drain regions 68 and 70. Memory cell 64 is shown schematically in FIG. 8, and is to be understood that the memory cell can comprise other features, such as, for example, spacers, and additional source/drain regions, including heavily doped and/or lightly doped regions. Gate structure 66 comprises a floating gate 72, and a control gate 74. Gates 72 and 74 comprise conductive materials, such as, for example, conductively doped silicon (for example, conductively doped polysilicon) and/or metals and/or metal silicide. Floating gate 72 is separated from substrate 62 by a dielectric material 76, and gates 74 and 72 are separated from one another by a second dielectric material 78. One or both of dielectric materials 76 and 78 can comprise silicon-doped aluminum oxide, and can be formed by the methodology of the present invention, such as the methodology shown schematically in FIG. 9. In preferred embodiments, the intergate dielectric material 78 will comprise silicon-doped aluminum oxide, and in particular embodiments can consist of silicon-doped aluminum oxide.

It is noted that relative positions are indicated herein and in the claims that follow by elevational terms such as "over." It is to be understood that such elevational terms are defining only relative positions of structural elements to one another, and not absolute elevational positions. Thus, a structure referred to herein as being "over" another can appear to be either under, over or beside the other structure to an external observer viewing a device encompassed by the claims.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a memory device, comprising:
    forming a first insulating layer over a substrate;
    forming a floating gate over the first insulating layer, the floating gate comprising a metal;
    forming a second insulating layer over the floating gate, the second insulating layer comprising a material that differs from the first insulating layer;
    forming a control gate over the second insulating layer; and
    the second insulating layer comprising $Al_2O_3$ doped with silicon atoms, and being formed by:
    evaporating aluminum oxide from a single crystal sapphire;
    evaporating silicon monoxide from a source of silicon monoxide;
    forming a vapor mixture comprising the evaporated aluminum oxide and evaporated silicon monoxide in a reaction chamber; and
    depositing at least some of the evaporated aluminum oxide and silicon from the silicon monoxide to form the $Al_2O_3$ doped with silicon atoms.

2. The method of claim 1 wherein the co-evaporation and deposition is conducted in a chamber, and wherein there is no $O_2$ flowed into the chamber during the co-evaporation and deposition.

3. The method of claim 1 wherein the substrate comprises silicon.

4. The method of claim 1 wherein the substrate comprises monocrystalline silicon.

5. A method of forming a memory device, comprising:
    forming a first insulating layer over a substrate;
    forming a metal-comprising floating gate over the first insulating layer;
    forming a second insulating layer over the floating gate;
    forming a control gate over the second insulating layer; and
    only the first of the first and second insulating layers comprising $Al_2O_3$ doped with silicon atoms; the first insulating layer being formed by co-evaporation of aluminum oxide and silicon monoxide, and deposition of at least some of the evaporated aluminum oxide and silicon from the silicon monoxide to form the $Al_2O_3$ doped with silicon atoms.

6. The method of claim 5 wherein the $Al_2O_3$ doped with silicon atoms comprises from 0.1 weight percent to 30 weight percent of silicon dopant.

* * * * *